(12) United States Patent
Zhang et al.

(10) Patent No.: US 10,931,227 B2
(45) Date of Patent: Feb. 23, 2021

(54) LIGHT-HEAT ENERGY GATHERING SOLAR ENERGY DEVICE

(75) Inventors: Jiwen Zhang, Shanghai (CN); Xinyun Zhang, Shanghai (CN)

(73) Assignee: Zhang Jiwen, Shanghai (CN)

( * ) Notice: Subject to any disclaimer, the term of this patent is extended or adjusted under 35 U.S.C. 154(b) by 1603 days.

(21) Appl. No.: 12/298,998

(22) PCT Filed: Mar. 15, 2007

(86) PCT No.: PCT/CN2007/000839
§ 371 (c)(1),
(2), (4) Date: May 26, 2009

(87) PCT Pub. No.: WO2007/124654
PCT Pub. Date: Nov. 8, 2007

(65) Prior Publication Data
US 2009/0293939 A1    Dec. 3, 2009

(30) Foreign Application Priority Data

Apr. 30, 2006  (CN) .......................... 200610026319.7

(51) Int. Cl.
*H02S 40/44*  (2014.01)
*H01L 31/054*  (2014.01)
*F24S 23/75*  (2018.01)

(52) U.S. Cl.
CPC .............. *H02S 40/44* (2014.12); *F24S 23/75* (2018.05); *H01L 31/0547* (2014.12);
(Continued)

(58) Field of Classification Search
USPC ................................................ 136/246, 249
See application file for complete search history.

(56) References Cited

U.S. PATENT DOCUMENTS

| 4,424,804 A | 1/1984 | Lee |
| 2005/0166952 A1* | 8/2005 | Ransquin et al. ............ 136/246 |

(Continued)

FOREIGN PATENT DOCUMENTS

| CN | 2205945 Y | 8/1995 |
| CN | 1158970 A | 9/1997 |

(Continued)

*Primary Examiner* — Dustin Q Dam
(74) *Attorney, Agent, or Firm* — Hamre, Schumann, Mueller & Larson, P.C.

(57) ABSTRACT

A light-heat gathering solar energy device belonging to the energy device, which is a device for decreasing the area occupied by the solar energy device and increasing the light-heat absorbing efficiency of the sun light, comprising: a bracket structure, which is a structural member having a hollow body; at least one solar energy absorbing device disposed within the hollow body of said bracket structure, the hollow body is formed by the container wall having a geometry structure of upper-wide lower-narrow shape, and at least one cup-shaped bottom structure is disposed therein, said container wall is composed of an outer wall and an inner wall, said outer wall is made of a light-heat absorbing material, said inner wall is made of a light reflecting material, allowing invisible light to penetrate, inward and downward reflection is enabled in the energy absorbing device through the inner wall when the sun light irradiates from the top to the bottom such that the light-heat energy gathering effect is produced within the solar energy absorbing device, and said cup-shaped bottom structure is made of a light-heat absorbing material without a light reflecting layer. Different materials are used in the invention based on different applications, and the device can be used as a solar energy electricity device or a heat energy device and as equipment configured to provide heat energy and electricity.

10 Claims, 5 Drawing Sheets

(52) U.S. Cl.
CPC ............... *Y02E 10/40* (2013.01); *Y02E 10/52* (2013.01); *Y02E 10/60* (2013.01)

(56) References Cited

U.S. PATENT DOCUMENTS

2006/0157724 A1* 7/2006 Fujita ..................... B29C 39/10
257/99
2008/0000516 A1* 1/2008 Shifman ..................... 136/246

FOREIGN PATENT DOCUMENTS

| | | |
|---|---|---|
| CN | 2694178 Y | 4/2005 |
| GB | 2 011 064 A | 7/1979 |
| JP | 2005-326140 A | 11/2005 |

* cited by examiner

LIGHT-HEAT ENERGY GATHERING SOLAR ENERGY DEVICE

TECHNICAL FIELD

The invention relates to an energy source device, particularly, relates to a solar energy device, which is capable of gathering light and heat.

BACKGROUND ART

Solar energy is a reproducible energy source, which can be gathered without exhaustion, therefore various types of the devices, which use the solar energy as energy source, can be found on the market, such as solar electricity generator, solar stove, solar energy heat gathering device, and the like. For the solar energy devices provided currently on the market, the method of absorbing heat and the method of absorbing light are used therein for gathering the light energy and the heat energy; and a planar form, a tube form, a groove form, or a paraboloid form may be used mostly as the device (solar energy plate) for gathering the light energy and the heat energy. A large area may be occupied by the solar energy plate of such type of the product, however, the heat energy gathering effect and the light energy gathering effect for the light energy and the heat energy of the solar energy are generic.

ENCLOSURE OF THE INVENTION

The object of the invention is to solve the above problems and to provide a light-heat energy gathering solar energy device, which is capable of increasing the light gathering area of the sun light, decreasing the area occupied by the solar energy device, and improving the light absorbing effect and heat absorbing effect.

The object of the invention can be implemented as follows:

A light-heat gathering solar energy device, comprising:

a bracket structure, which is a structural member having a hollow body;

at least one solar energy absorbing device disposed within the hollow body of the bracket structure, the hollow body is made of the container wall having a geometry structure of upper-wide lower-narrow shape, and at least one bottom member of a cup-shaped energy absorbing zone is disposed therein, the container wall is composed of an outer wall and an inner wall which is adjacent closely to the outer wall, the outer wall is made of light-heat absorbing material, the inner wall is a material which can reflect light and penetrate invisible light, the inner wall structure has an arc shape or a plate shape, inward and downward reflection is enabled in the energy absorbing device when the sun light irradiates from the top to the bottom such that the light-heat energy gathering effect is produced within a bottom member of a cup-shaped energy absorbing zone inside the solar energy absorbing device, the bottom member of the cup-shaped energy absorbing zone is made of the same material as that of the outer wall of the solar energy absorbing device.

Several energy absorbing holes arranged in order and formed by the hole wall and the bottom plate are disposed on the inner wall of the solar energy absorbing device, the material for producing the hole wall of the energy absorbing hole is the same as that for producing the container wall of the solar energy absorbing device, the material for producing the bottom plate of the energy absorbing hole is the same as that for producing the outer wall of the solar energy absorbing device.

A heat insulating seal layer made of transparent, light transmitting material is disposed on the top portion of the solar energy absorbing device to enhance the heat insulating and heat gathering effect of the heat energy.

When the outer wall of the container wall of the solar energy absorbing device is a tube-plate-shape solar heat collector used as a plate-shape heater, a light reflecting material for absorbing heat is used for the inner wall, a tube-plate-shape solar heat collector as same as that of the outer wall is used for the bottom member of the bottom member of the cup-shaped energy absorbing zone, and a layer of the heat insulating material layer is disposed outside the outer wall and the bottom member of the cup-shaped energy absorbing zone.

When the outer wall of the container wall of the solar energy absorbing device is a plate-shape solar cell used as a plate-shape photovoltaic cell, a light reflecting material allowing invisible light to penetrate is used for the inner wall, a plate-shape solar cell as same as that of the outer wall is used for the bottom member of the cup-shaped energy absorbing zone, and a cell plate assembly is disposed outside the outer wall and the bottom member of the cup-shaped energy absorbing zone.

When the outer wall of the container wall of the solar energy absorbing device is a plate-shape solar cell used as a plate-shape photovoltaic cell, a light reflecting material allowing invisible light to penetrate is used for the inner wall, and a tube-plate-shape solar heat collector used as a plate-shape heater is used for the bottom member of the cup-shaped energy absorbing zone.

When the outer wall of the container wall of the solar energy absorbing device is a tube-plate-shape solar heat collector used as a plate-shape heater, a light reflecting material for absorbing heat is used for the inner wall, and a plate-shape solar cell used as a plate-shape photovoltaic cell is used for the bottom member of the cup-shaped energy absorbing zone.

A solar energy application device secured on the bracket structure is disposed at the lower portion of the solar energy absorbing device. The solar energy application device comprises solar stove, solar oven, and solar fireplace.

The bracket structure is composed of a metal structure, a frame structure, or a member of brick concrete structure.

The efficacy of the invention is:

The solar energy device of the invention is a solar electricity generating-heat providing device for a structural member, and it is supported and protected by the bracket structure having a metal structure, or a frame structure, or a brick concrete structure.

As a solar electrical energy device, the solar energy device of the invention constitutes a solar energy electricity generation and storage device through converting the optical energy to the electrical energy, and connecting with a solar energy regulating device, a solar cell, a storage cell, an electricity consuming device or connecting directly with a power supplying system.

As a solar heat energy device, the solar energy device of the invention constitutes a solar heat energy device through converting the solar heat energy to the physical heat energy (such as hot water, hot oil, hot steam, and the like), and transferring to a heat storage device, a temperature control device, a heat energy application device (such as a central heating device, a solar energy air conditioning device, a water heating device, and the like).

The light-heat absorbing region of the solar energy device of the invention is located at the central and lower portions of the solar energy device so that it increases the energy gathering and application efficiency of the light energy and heat energy of the plate-shape solar cell and the plate-shape heater, increases the contact area of the sun light energy gathering, and decreases the area occupied by the solar energy device.

The present solar energy device can widely be used by the users and enterprises in the town, countryside, and mountainous area. It possesses significant economic and social benefits for saving the energy resources, protecting the environment, and reducing to fell the trees.

In the town region, the present device can be configured commercially with the villas and high-level apartments so that it possesses a future of popularizing commercially. Further more, the present device possesses excellent practicability, it can be installed simply and easily in the countryside or mountainous area according to this manner, for example, heat insulation brick, heat insulation soil, heat insulation grout, and the like, can be selected as the heat insulating material, cheap reflective materials can be selected as the light reflecting layer, and cheap tubes can be selected as the heat energy gathering material. Therefore, the present device can decrease the cost in the countryside thereby possessing an excellent prospect for popularizing.

The solar energy device of the invention can be used as a solar energy power plant, electricity generation for central heat supplying plant, and heat supplying device, possessing significant economic and social benefits.

In order to describe further the above object, structure feature and effect of the invention, the present invention will be described in detail by incorporating the accompanying drawings as follows.

MODE OF CARRYING OUT THE INVENTION

The embodiments of the light-heat energy gathering solar energy device of the invention will be described in detail by incorporating the accompanying drawings as follows.

Figure 1:
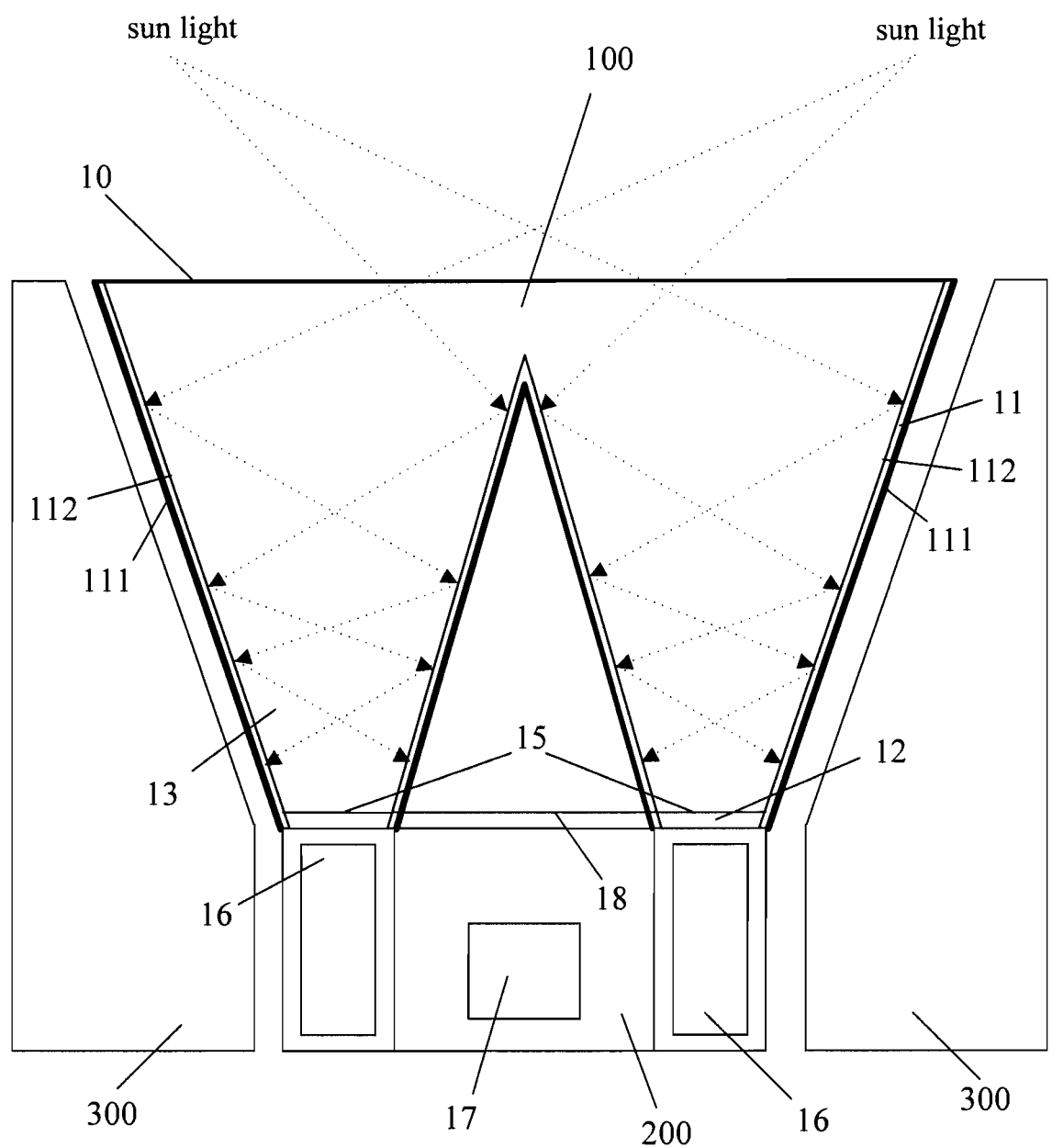
FIG. 1 is a schematic diagram of a cross sectional structure of a solar energy device at a longitudinal direction according to an embodiment of the invention.

FIG. 1 is a schematic diagram of a cross sectional structure of a solar energy device at a longitudinal direction according to an embodiment of the invention.

As shown in the figure, the structure of the light-heat energy gathering solar energy device of the invention will be described.

The invention comprises a bracket structure 300, which is a hollow structural member, the bracket structure 300 has a metal structure, a frame structure, or a member of brick concrete structure, and it is a bracket for supporting the solar energy device.

The invention further comprises a solar energy absorbing device 100 disposed within the hollow body of the bracket structure 300, the hollow body is formed by a container wall 11 having a upper-wide lower-narrow geometry structure, and at least one bottom member 12 of a cup-shaped energy absorbing zone is disposed therein, the container wall 11 is composed of an outer wall 111 and an inner wall 112 which is adjacent closely to the outer wall 111, the outer wall 111 is made of a light-heat absorbing material, the inner wall 112 uses a light reflecting layer made of a reflective material, the inner wall structure has an arc shape or plate shape, inward and downward reflection is enabled in the energy absorbing device when the sun light irradiates from the top to the bottom such that the light-heat energy gathering effect is produced within the bottom member 12 of the cup-shaped energy absorbing zone inside the solar energy absorbing device, the bottom member 12 of the cup-shaped energy absorbing zone is made of the same material as that of the outer wall 111 of the solar energy absorbing device 100 without a light reflecting layer.

In order to allow the energy storage effect of the solar energy absorbing device 100 to be more excellent, a heat insulating seal layer 10 made of a transparent, light-transmitting material is disposed on the top portion of the solar energy absorbing device 100 to enhance the heat preserving-energy gathering effect of the heat energy. Toughened glass can be used for the heat insulating seal layer 10 so that the solar energy absorbing device 100 having such a seal structure can enhance the heat insulating-energy gathering effect of the heat energy to decrease the elimination of the heat energy and prevent from eroding by the rain, and it allows the solar energy device installed on the building to be visually beautiful.

Figure 2:
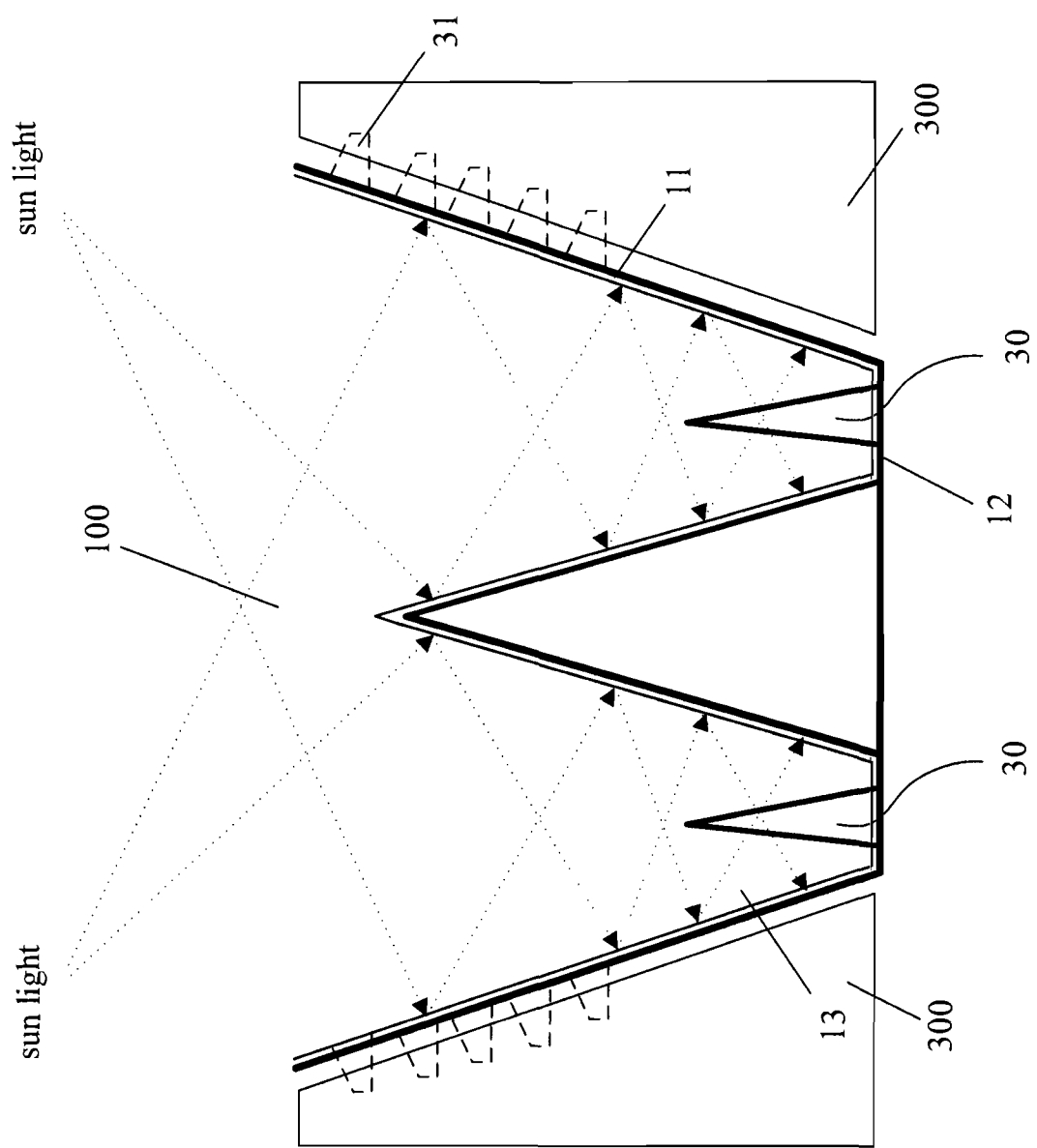
FIG. 2 is a schematic diagram of a solar energy absorbing device, in which a transparent, light-transmitting heat insulating layer is not used on the top portion.

For the large power plant and central heat plant, the seal method may not be used on the top portion of the solar energy absorbing device 100, as shown in FIG. 2. FIG. 2 is a schematic diagram of a solar energy absorbing device, in which a transparent, light-transmitting heat insulating layer is not used on the top portion. At this time, in order to increase the energy absorbing efficiency of the solar energy absorbing device 100, several energy absorbing holes 31 arranged in order are disposed on the inner wall 111 of the solar energy absorbing device 100, the energy absorbing hole 31 is formed by the hole wall and the bottom plate, the material for forming the hole wall of the energy absorbing hole 31 is the same as that for forming the container wall 11 of the solar energy absorbing device 100, the material for forming the bottom plate of the energy absorbing hole 31 is the same as that for forming the outer wall 112 of the solar energy absorbing device 100 without a light reflecting layer.

Referring to FIG. 2, in order to increase the energy efficiency of the solar energy absorbing device 100, an energy absorbing post 30 is further disposed on the central region of the bottom member 12 of the cup-shaped energy absorbing zone of the solar energy absorbing device 100, the energy absorbing post 30 is of a tube form or a pole form or a plate form. The energy absorbing post 30 is made of a heat-light absorbing material without light reflecting layer.

Different materials are used according to different applications of the solar energy absorbing device 100.

Figure 3:
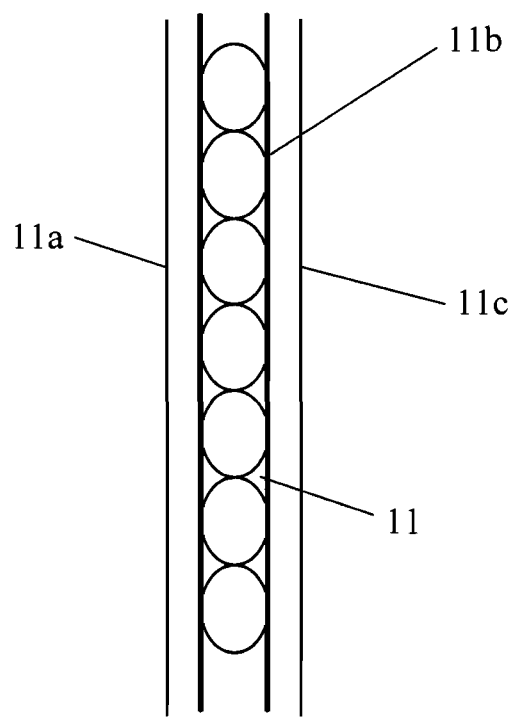
FIG. 3 is a structure diagram of a container wall of a solar energy absorbing device when the solar energy absorbing device is a heat energy gathering device.
Figure 5:
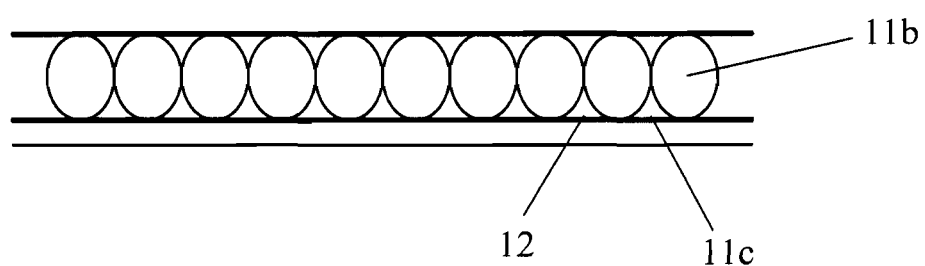
FIG. 5 is a structure diagram of a bottom plate of a solar energy absorbing device when the solar energy absorbing device is a heat energy gathering device.

FIG. 3 is a structure diagram of a container wall of a solar energy absorbing device when the solar energy absorbing device is a heat energy gathering device. As shown in the figure, when the solar energy absorbing device 100 is used as a heat energy gathering device, the outer wall 11b uses a tube-plate-shape solar heat collector (using a copper tube-plate-shape solar heat collector or vacuum glass tube tailored on the market) for heat gathering, the shape of the heat gathering tube may be an oval shape, or a square shape, or a rectangular shape, and the like. At this time, the inner wall 11a uses a heat absorbing-light reflecting material (for example, using a light reflecting material having silver plated layer thereon). The bottom plate 12b uses a tube-plate-shape solar heat collector as same as that of the outer wall 11b (without light reflecting layer), as shown in FIG. 5. FIG. 5 is a structure diagram of a bottom plate of a solar energy absorbing device when the solar energy absorbing device is a heat energy gathering device. As shown in FIGS. 3, 5, in order to achieve more excellent heat insulating effect, when the tube-plate-shape solar heat collector is used as the outer wall 11b and the bottom plate 1b, a heat insulating material layer 11c (for example, polyurethane heat insulating layer can be used) is disposed outside the outer wall 11b and the bottom plate 12b. When the solar energy absorbing device 100 is a heat energy gathering device, the outside of the container wall 11 of the solar energy absorbing device 100 is covered by a further layer of heat insulating material (such as heat insulating brick stack).

Figure 4:
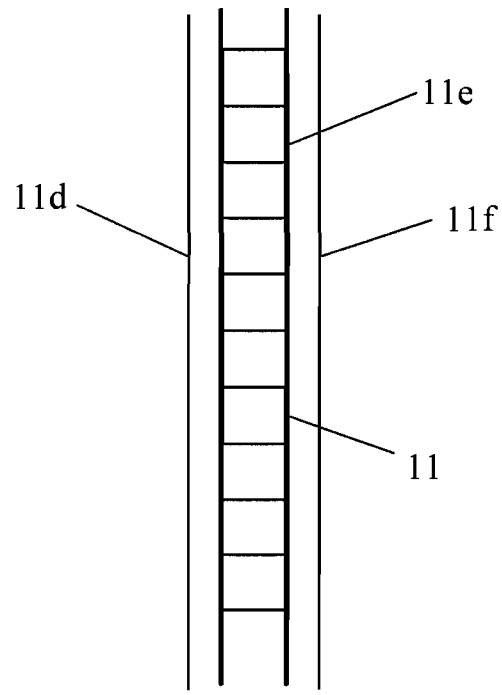
FIG. 4 is a structure diagram of a container wall of a solar energy absorbing device when the solar energy absorbing device is a light energy gathering device.
Figure 6:
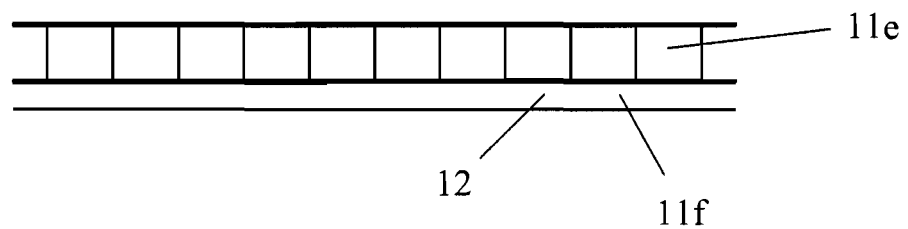
FIG. 6 is a structure diagram of a bottom plate of a solar energy absorbing device when the solar energy absorbing device is a light energy gathering device.

FIG. 4 is a structure diagram of the container wall of a solar energy absorbing device when the solar energy absorbing device is a solar energy electricity device. As shown in the figure, when the solar energy plate 100 is used as a plate-shape solar cell of the solar energy electricity device, the outer wall 11e uses a plate-shape solar cell (using an infrared plate-shape solar cell supplied on the market). At this time, the inner wall 11d may use a light reflecting material which allows the invisible light to penetrate (may be a blue quartz glass layer having meson film vacuum plated thereon). The bottom plate 12e uses a plate-shape solar cell as same as that of the outer wall 11e (without the light reflecting layer), as shown in FIG. 6. FIG. 6 is a structure diagram of a bottom plate of a solar energy absorbing device when the solar energy absorbing device is a light energy gathering device. As shown in FIGS. 4, 6, when the solar energy electricity device is a plate-shape solar cell, a cell plate assembly 11f is disposed outside the outer wall 11e and the bottom plate 12e.

The solar energy absorbing device 100 can be further produced by using the following materials according to different requirements.

When the light, heat absorbing material used by the outer wall 111 of the container wall 11 of the solar energy absorbing device is used as a plate-shape solar cell of the plate-shape photovoltaic cell, a light reflecting material allowing the invisible light to penetrate is used for the inner wall 112, and a tube-plate-shape solar heat collector used as the plate-shape heater is used for the bottom member 12 of the cup-shaped energy absorbing zone.

When the light, heat absorbing material used by the outer wall 111 of the container wall 11 of the solar energy absorbing device is used as a tube-plate-shape solar heat collector used by the plate-shape heater, a heat absorbing-light reflecting material is used for the inner wall 112, and a plate-shape solar cell used as the plate-shape photovoltaic cell is used for the bottom member 12 of the cup-shaped energy absorbing zone.

In the invention, a solar energy application device 200 secured on the bracket structure 300 can also be disposed on the lower portion of the solar energy absorbing device 100 (as shown in FIG. 1).

The solar energy application device 200 of the invention may comprise a solar stove 18 (a heat transferring device 15 of the solar stove is disposed on the solar stove 18), a solar oven 16 (a rotation plate and a temperature control device for decreasing or increasing the temperature by adjusting the temperature of the water in the heat gathering tube are disposed in the solar oven 16), a solar fireplace 17 (having temperature control device) and medium size type and small size type solar electricity storage, solar water heating device, and devices for configuring with the solar central heating device, solar energy air conditioning device to supply heat energy and electricity (not shown)), as shown in FIG. 1.

The above solar oven 16 can roast foods or roast and process articles. The above solar stove 18 can process foods through the heat transferring device. For the present device, various spare methods, such as installing and using firewood stove, natural gas stove, or electrical heating stove, can be selected during the less sunshine days based on the practical situation of the site. The above solar fireplace 17 is a heating-heat insulating device for providing the indoor warm air.

The present solar energy device has the application function of using as a solar cell to generate electricity or as a heat energy device to supply heat, the electricity or heat energy is transferred to the electricity storage, electricity consuming device or heat storage device, temperature control device, heat energy application device, for providing various services, such as electrical energy service, heat supplying service, hot water supplying service.

The present solar energy device can also be a combination of the plate-shape heater, electrical energy plate, and two kinds of the energy resources, such as the light energy, the heat energy, of the sun light used at a maximum. For an application of the solar energy device as a solar cell to generate electricity, a combination body of two forms of a solar cell assembly which absorbs penetrable light energy-heat energy (that is, invisible light, such as infrared light, and the like) or a solar cell assembly which absorbs visible radiation) can be used as the upper and lower electrical energy plate structure of the energy absorbing device so that various forms of the light energy resources of the sun light can be used sufficiently.

As an independent product, the solar energy device of the invention can be used widely for various sites where the electrical energy, heat energy are required, such as the factories, residences, solar energy power plants, central heating plants, and the like.

The energy gathering procedure of the light-heat gathering solar energy device having the above structure will be described as follows.

In the invention, the optical reflection principle is used for absorbing light, absorbing heat of the solar energy.

In the solar energy absorbing device 100 of the invention, the sun light in the solar energy absorbing device 100 reflects inwardly, downwardly for plural times through the inner wall 112 of the solar energy absorbing device 100 (as shown by the dash line in FIG. 1), because no light reflecting layer is disposed on the bottom region of the solar energy absorbing device, so the light and heat of the sun radiation are gathered sufficiently in the solar energy absorbing device, if it is supposed that the height of the solar energy absorbing device 100 is h, then beginning from the bottom plate 12 of the solar energy absorbing device 100, a bottom region having about ½ h is a region having the best light-heat gathering effect (as a region labeled 13 shown in the figure), and referred to as an energy gathering region 13, such energy gathering method increases the usage efficiency of the gathered light energy, heat energy, evidently, the efficiency thereof is higher than that of the plan plate type solar energy gathering device, in the practical application, the contact area for gathering sun light is increased, and the light-heat gathering effect of the light energy, heat energy of the sun radiation are enhanced, and the area occupied by the solar energy plate is saved.

If the solar energy absorbing device 100 is used as a light gathering device, that is, photovoltaic cell device, then when the sun light is reflected by the reflective material or reflective coating layer of the light reflecting layer 11*d*, a portion of various forms of invisible light energy, such as the infrared radiation of the sun light, can penetrate the light reflecting layer 11*d* and the light is gathered on the outer wall 11*b*, while another portion is reflected by the light reflecting layer 11*d* for plural times so that the light gathering efficiency is increased.

Those skilled in the art should understand, the above embodiments is used only to describe the invention, and not as a restriction to the invention, the changes, variations of the above embodiments will fall within the scope of the Claims of the invention as long as within the substantial spirit of the invention.

Figure 7:
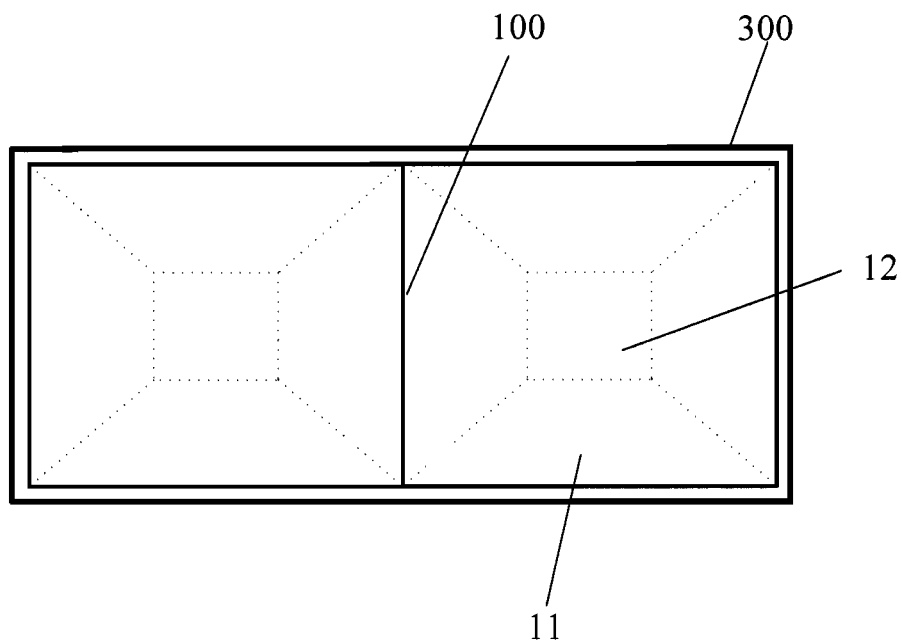
FIG. 7 shows a schematic plan diagram of a structure of the solar energy device when the solar energy absorbing device has a square shape or rectangular shape (or polygon shape)
Figure 8:
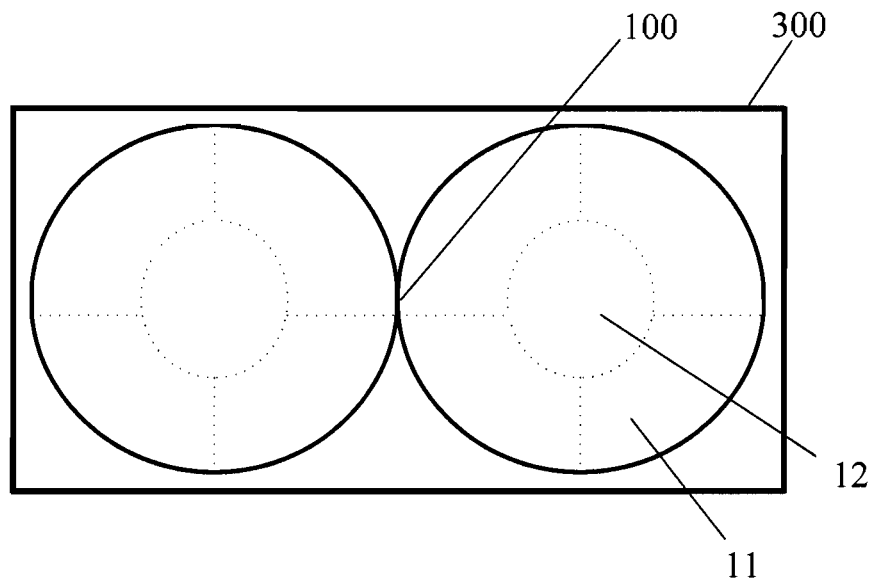
FIG. 8 shows a schematic plan diagram of a structure of the solar energy device when the solar energy absorbing device has a circular shape or oval shape.

For example, the solar energy absorbing device 100 of the inventive solar energy device has a geometry structure which is a narrow upper-wide lower-narrow shape, the cross sectional form thereof is a geometry structure having a narrow trapezoid structure or a narrow upper-wide lower-narrow structure, that is, a plan structure of a circular shape, an oval shape, a plan structure of a square shape, a rectangular shape, or a plan structure of a combination body of an arc shape or straight line. FIG. 7 shows a schematic plan diagram of a structure of the solar energy device when the solar energy absorbing device has a square shape or rectangular shape (or polygon shape). FIG. 8 shows a schematic plan diagram of a structure of the solar energy device when the solar energy absorbing device has a circular shape or oval shape.

What is claimed is:

1. A light-heat gathering solar energy device, comprising:
    a bracket structure, which is a structural member having a hollow body; and
    at least one solar energy absorbing device disposed within the hollow body of the bracket structure, the at least one solar energy absorbing device including a container wall forming a hollow body having an upper-wide and lower narrow shape disposed on a bottom member of a cup-shaped energy absorbing zone, the container wall having a geometry structure of an upper-wide lower-narrow shape and disposed on the bottom member of a cup-shaped energy absorbing zone,
    wherein the container wall has a layered structure formed by an outer wall and an inner wall attached to the outer wall, the inner wall covers an inner side of the outer wall to form the layered structure, and no spacing is provided at an interface between the outer wall and the inner wall in the layered structure,
    wherein the outer wall includes a light-heat absorbing layer and the inner wall includes a light reflecting layer,
    wherein the inner wall has a structure of an arc shape or a plate shape to enable inward and downward reflection of a sunlight beam irradiating from a top to a bottom of the inner wall to produce a light and/or heat energy gathering effect within the bottom member of a cup-shaped energy absorbing zone inside the at least one solar energy absorbing device, and the bottom member of a cup-shaped energy absorbing zone is made of a plate-shape heater or a plate-shape photovoltaic cell without a light reflecting layer,
    wherein the outer wall is disposed by tracking entirely the shape of the inner wall,
    wherein a portion of the container wall located closest to a solar energy application device is made of a same material as that of the outer wall without an inner wall layer, and
    wherein the light-heat absorbing layer of the outer wall is a plate-shape solar cell.

2. The light-heat gathering solar energy device according to claim 1, wherein:
    a plurality of energy absorbing holes arranged in order and formed by hole walls and bottom plates are disposed on the inner wall, a material for producing the hole walls is the same as that for producing the container wall, and a material for producing the bottom plates is the same as that for producing the outer wall.

3. The light-heat gathering solar energy device according to claim 1, wherein:
    an energy absorbing post is also disposed on a central region of the bottom member of a cup-shaped energy absorbing zone of the at least one solar energy absorbing device, and the energy absorbing post is made of a heat and/or light absorbing material without a light reflecting layer.

4. The light-heat gathering solar energy device according to claim 1, wherein:
    a heat insulating seal layer made of a transparent, light transmitting material is disposed on a top portion of the at least one solar energy absorbing device to enhance a heat preserving and heat gathering effect of heat energy.

5. The light-heat gathering solar energy device according to claim 1, wherein:
    a solar energy application device secured on the bracket structure is disposed at a lower portion of the at least one solar energy absorbing device, the solar energy application device comprises solar stove, solar oven, or solar fireplace.

6. The light-heat gathering solar energy device according to claim 1, wherein:
    the bracket structure is composed of a metal structure, a frame structure, or a member of brick concrete structure.

7. The light-heat gathering solar energy device according to claim 1, wherein:
    the outer wall is a tube-plate-shape solar heat collector, the inner wall is a light reflecting material for absorbing heat, the bottom member of a cup-shaped energy absorbing zone structure is a tube-plate-shape solar heat collector.

8. The light-heat gathering solar energy device according to claim 1, wherein:
    the outer wall is a tube-plate-shape solar heat collector, the inner wall is a light reflecting material for absorbing heat, the bottom member of a cup-shaped energy absorbing zone is a plate-shape solar cell.

9. The light-heat gathering solar energy device according to claim 1, wherein:

the outer wall is a plate-shape solar cell, the inner wall is a light reflecting material allowing invisible light to penetrate, the bottom member of a cup-shaped energy absorbing zone is a plate-shape solar cell.

10. The light-heat gathering solar energy device according to claim 1, wherein:
the outer wall is a plate-shape solar cell, the inner wall is a light reflecting material allowing invisible light to penetrate, the bottom member of a cup-shaped energy absorbing zone is a tube-plate-shape solar heat collector.

* * * * *